United States Patent
Liu et al.

(10) Patent No.: US 8,841,062 B2
(45) Date of Patent: Sep. 23, 2014

(54) POSITIVE WORKING PHOTOSENSITIVE MATERIAL

(71) Applicants: Weihong Liu, Bridgewater, NJ (US); Ping-Hung Lu, Bridgewater, NJ (US); Medhat Toukhy, Flemington, NJ (US); SookMee Lai, Kakegawa (JP); Yoshiharu Sakurai, Kakegawa (JP); Aritaka Hishida, Kakegawa (JP)

(72) Inventors: Weihong Liu, Bridgewater, NJ (US); Ping-Hung Lu, Bridgewater, NJ (US); Medhat Toukhy, Flemington, NJ (US); SookMee Lai, Kakegawa (JP); Yoshiharu Sakurai, Kakegawa (JP); Aritaka Hishida, Kakegawa (JP)

(73) Assignee: AZ Electronic Materials (Luxembourg) S.A.R.L., Luxembourg (LU)

( * ) Notice: Subject to any disclaimer, the term of this patent is extended or adjusted under 35 U.S.C. 154(b) by 0 days.

(21) Appl. No.: 13/693,496

(22) Filed: Dec. 4, 2012

(65) Prior Publication Data

US 2014/0154624 A1    Jun. 5, 2014

(51) Int. Cl.
*G03F 7/00* (2006.01)
*G03F 7/26* (2006.01)
*G03F 7/004* (2006.01)

(52) U.S. Cl.
CPC .................................. *G03F 7/0045* (2013.01)
USPC .................. 430/270.1; 430/271.1; 430/277.1; 430/281.1; 430/306

(58) Field of Classification Search
USPC ............................................... 430/270.1–331
See application file for complete search history.

(56) References Cited

U.S. PATENT DOCUMENTS

| | | | |
|---|---|---|---|
| 4,956,035 A | 9/1990 | Sedlak | |
| 6,358,665 B1 * | 3/2002 | Pawlowski et al. | 430/270.1 |
| 2007/0015080 A1 * | 1/2007 | Toukhy et al. | 430/270.1 |
| 2007/0275320 A1 * | 11/2007 | Washio et al. | 430/270.1 |
| 2011/0214994 A1 | 9/2011 | Utsumi et al. | |

OTHER PUBLICATIONS

Specification of U.S. Appl. No. 13/524,790, filed Jul. 15, 2012 with cover page.

* cited by examiner

*Primary Examiner* — Chanceity Robinson
(74) *Attorney, Agent, or Firm* — Sangya Jain

(57) ABSTRACT

Disclosed herein is a photosensitive composition comprising a heterocyclic thiol compound or tautomeric form thereof and its method of use on a substrate, which may include a chalcophile substrate.

20 Claims, No Drawings

POSITIVE WORKING PHOTOSENSITIVE MATERIAL

FIELD OF THE INVENTION

The present application for patent is in the field of photoresist imaging. More specifically, the present application for patent discloses and claims a positive working photosensitive material which may, without limitation, be useful on chalcophilic or reflective substrates.

BACKGROUND

In the field of electronic device manufacturing, imaging materials must be made to perform on a variety of substrates. It is known in the art that different substrates may pose different challenges. For example, reflective, highly conductive substrates may impose optical conditions within the imageable films that lead to phenomena such as scumming, footing, standing wave artifacts such as "scallops" and the like. Further, interfacial issues may arise from poor adhesion. Poor adhesion may result in undercutting or delamination of the film during development. On the other hand, the film may exhibit strong adhesion to certain types of substrates that may result in foot formation or scumming.

There have been several attempts to manage the above optical and interfacial phenomena. To improve adhesion, substrate treatments have been described. For example, in U.S. Pat. No. 4,956,035, Sedlak discloses and claims "a composition for promoting the adhesion of an organic compound to a metal surface, which comprises an etching solution, an effective amount of a quaternary ammonium cationic surfactant, and a solubilizing amount of a secondary surfactant or solvent." This composition is said to be useful for improving photoresist adhesion to copper-clad circuit boards, and for improving adhesion of solder masks to printed circuits. However, while this treatment may be effective on such substrates as copper-clad circuit boards, its utility may be problematic on semiconductor substrates, which require much more precision, particularly where etch chemistries may be involved.

As a further example, in U.S. Pat. Appl. No. 2011/0214994, Utsumi et al. disclose a "pretreating agent for electroplating pertaining to the present invention [which] is characterized in that it includes an aqueous solution containing: (A) at least one anti-adsorption agent selected from among a triazole compound, a pyrazole compound, an imidazole compound, a cationic surfactant and an amphoteric surfactant; and (B) chloride ion as essential ingredients." The pretreating agent may also contain a nonionic surfactant, and at least one solvent selected from among water-soluble ethers, amines, alcohols, glycol ethers, ketones, esters, and fatty acids, and an acid, and an oxidizing agent. While this formulation contains ingredients that arguably perform an anti-adsorption function, its use may be incompatible with semiconductor processing because it adds an extra step and requires a separate feed stream.

Therefore, there remains a need for a positive working photosensitive material with a composition suited for imaging on reflective and chalcophilic substrates that produces low defect, images at high resolution. As will become apparent, the subject matter disclosed herein addresses the above need.

DETAILED DESCRIPTION

As used herein, the conjunction "or" is not intended to be exclusive unless otherwise indicated or required by the context. For example, the phrase "or, alternatively" is intended to be exclusive. As a further example, "or" may be exclusive when describing chemical substitution at a specific site.

As used herein, the term "chalcophile" is an element that has an affinity for the chalcogen elements, sulfur, selenium and tellurium. Other than the chalcogens themselves, these elements may include copper, zinc, gallium, germanium, arsenic, silver, cadmium, lanthanum, tin, antimony, gold, mercury, thallium, lead, and bismuth. Without limitation, these elements may form bonds with one or more of the chalcogen elements that are primarily covalent in character. A chalcophile substrate comprises one or more of the above listed chalcophiles.

As used herein, it is understood that a repeat unit within a polymer may be referred to by its corresponding monomer. For example, acrylate monomer (1) corresponds to its polymer repeat unit (2).

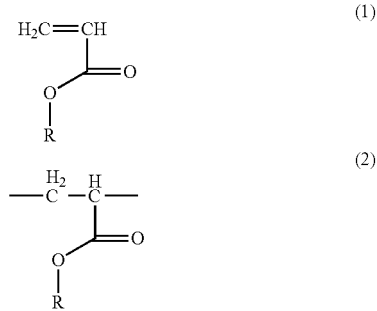

As used herein, the designation "(meth)acrylate repeat unit" may refer to an acrylate repeat unit or, alternatively, a methacrylate repeat unit. Accordingly, "acrylic acid" and "methacrylic acid" are collectively referred to as "(meth)acrylic acid", an "acrylic acid derivative" and a "methacrylic acid derivative" are collectively referred to as a "(meth)acrylic acid derivative", and "acrylate" and "methacrylate" are collectively referred to as "(meth)acrylate".

Disclosed herein is a positive working photosensitive composition comprising: at least one photoacid generator; at least one polymer comprising one or more (meth)acrylate repeat units and further comprising one or more repeat units with at least one acid cleavable group; at least one heterocyclic thiol compound comprising a ring structure chosen from the general formulas:

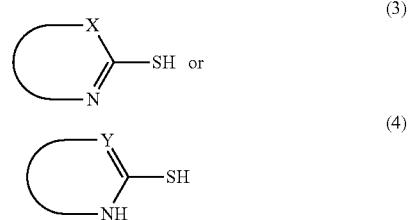

or tautomers thereof, wherein the ring structure is a single ring structure having 4-8 atoms, or a multi ring structure having 5-20 atoms, and wherein the single ring structure or the multi ring structure comprises an aromatic, non aromatic, or heteroaromatic ring, and wherein X is coupled into the ring by a single bond and is chosen from $CR_1R_2$, O, S, Se, Te, or $NR_3$, or X is coupled into the ring by a double bond and is chosen from CR$_1$, or N, and Y is chosen from CR$_1$ or N, and wherein R$_1$, R$_2$, and R$_3$ are the same or different and represent H, a substituted or unsubstituted alkyl group having 1-8 carbon atoms, a substituted or unsubstituted alkenyl group having 1-8 carbon atoms, a substituted or unsubstituted alkynyl group having 1-8 carbon atoms, or a substituted or unsubstituted aromatic or heteroaromatic group having 1-20 carbon atoms.

It is understood that the heterocyclic thiols, 3 and 4, represent one of potentially several tautomeric forms. For example, without limitation, 3 may occur as its prototropic tautomer, whether in equilibrium or disequilibrated.

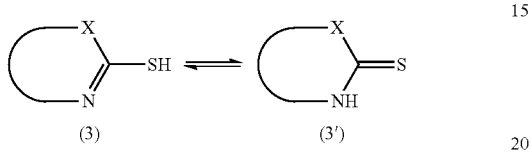

For example, without limitation, 4 may occur as its prototropic tautomer, whether in equilibrium or disequilibrated.

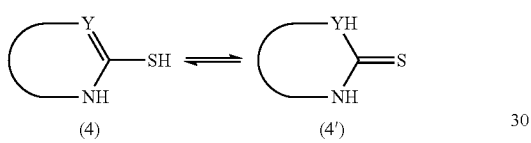

Moreover, interaction with a surface such as a chalcophilic surface or other components in solution may influence the relative concentrations of the ring structures, 3 and 4, and their respective tautomers. Accordingly, it is understood that prototropic tautomers (including annular tautomers) and valence tautomers may be referred to interchangeably by naming any of their tautomeric forms.

Further disclosed herein is a method of forming a positive relief image comprising: forming a photosensitive layer by applying the positive working photosensitive composition described herein to a substrate; image-wise exposing the photosensitive layer to actinic radiation to form a latent image; and developing the latent image in a developer. Optionally, the image-wise exposed photosensitive layer may be thermally treated, depending on the chemistry of deprotection.

The heterocyclic thiols in the photosensitive composition disclosed herein may include, without limitation, substituted or unsubstituted triazole thiols, substituted or unsubstituted imidazole thiols, substituted or unsubstituted triazine thiols, substituted or unsubstituted mercapto pyrimidines, substituted or unsubstituted thiadiazole-thiols, substituted or unsubstituted indazole thiols, tautomers thereof or combinations thereof. Substituents may include, without limitation, saturated or unsaturated hydrocarbon groups, substituted or unsubstituted aromatic rings, aliphatic, aromatic or heteroaromatic alcohols, amines, amides, imides carboxylic acids, esters, ethers, halides, and the like. Such substituents may be used in concert with the heterocyclic thiol to improve solubility, to modify interaction with the substrate, to enhance exposure to light or to act as an antihalation dye.

Such heterocyclic thiols may include, without limitation the following compounds in unsubstituted or substituted form:

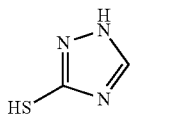

1H-1,2,4-triazole-3-thiol

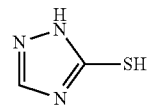

1H-1,2,4-triazole-5-thiol

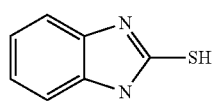

1H-benzo[d]imidazole-2-thiol

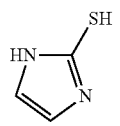

1H-imidazole-2-thiol

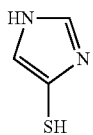

1H-imidazole-4-thiol

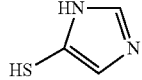

1H-imidazole-5-thiol

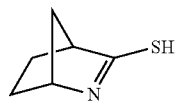

2-azabicyclo[2.2.1]hept-2-ene-3-thiol

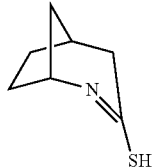

2-azabicyclo[3.2.1]oct-2-ene-3-thiol

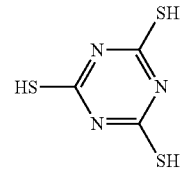

1,3,5-triazine-2,4,6-trithiol

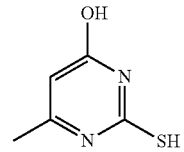

2-mercapto-6-methylpyrimidin-4-ol

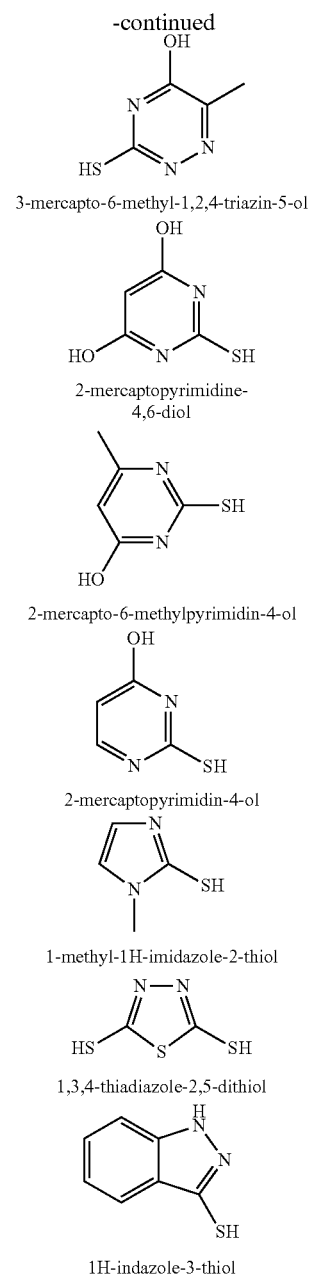

Thiouracil derivatives such as 2-thiouracil are further examples. These include, without limitation, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thiouracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradodecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-t-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil.

The photosensitive composition disclosed herein may include a variety of photoacid generators, such as onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, sulfonic acid ester derivatives, imidoyl sulfonate derivatives, halogenated triazine compounds, diazonaphthoquinone sulfonate esters or combinations thereof.

Onium salt photoacid generators may comprise, without limitation, alkyl sulfonate anions, substituted and unsubstituted aryl sulfonate anions, fluoroalkyl sulfonate anions, fluoarylalkyl sulfonate anions, fluorinated arylalkyl sulfonate anions, hexafluorophosphate anions, hexafluoroarsenate anions, hexafluoroantimonate anions, tetrafluoroborate anions, equivalents thereof or combinations thereof.

Specifically, without limitation, suitable photoacid generators may include triphenylsulfonium trifluoromethanesulfonate, triphenylsulfonium nonafluoro-n-butanesulfonate, triphenylsulfonium perfluoro-n-octanesulfonate, and triphenylsulfonium 2-(bicyclo[2.2.1]heptan-2-yl)-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-(bicyclo[2.2.1]heptan-2-yl)-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, and 4-methanesulfonylphenyldiphenylsulfonium 2-(bicyclo[2.2.1]heptan-2-yl)-1,1,2,2-tetrafluoroethanesulfonate, diphenyliodonium trifluoromethanesulfonate, diphenyliodonium nonafluoro-n-butanesulfonate, diphenyliodonium perfluoro-n-octanesulfonate, diphenyliodonium 2-(bicyclo[2.2.1]heptan-2-yl)-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-(bicyclo[2.2.1]heptan-2-yl)-1,1,2,2-tetrafluoroethanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-(bicyclo[2.2.1]heptan-2-yl)-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-(bicyclo[2.2.1]heptan-2-yl)-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, dimethyl-4-hydroxyphenyl)tetrahydrothiophenium perfluoro-n-octanesulfonate, 1-(3,5-dimethyl-4-hydroxyphenyl)tetrahydrothiophenium 2-(bicyclo[2.2.1]heptan-2-yl)-1,1,2,2-tetrafluoroethanesulfonate N-(trifluoromethanesulfonyloxy)bicyclo[2.2.1]hept-5-ene-2,3-dicarboximide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-[2-(bicyclo[2.2.1]heptan-2-yl)-1,1,2,2-tetrafluoroethanesulfonyloxy]bicyclo[2.2.1]hept-5-ene-2,3-dicarboxylmide, 1,3-dioxo-1H-benzo[de]isoquinolin-2(3H)-yl trifluoromethanesulfonate(naphthalene dicarboximidyl triflate), N-[2-(tetracyclo[4.4.0.1$^{2,5}$.1$^{7,10}$]dodecan-3-yl)-1,1-difluoroethanesulfonyloxy]bicyclo[2.2.1]hept-5-ene-2,3-dicarboxylmide, 1,3-dioxoisoindolin-2-yl trifluoromethanesulfonate, 1,3-dioxoisoindolin-2-yl nonafluoro-n-butane sulfonate, 1,3-dioxoisoindolin-2-yl perfluoro-n-octane sulfonate, 1,3-dioxoisoindolin-2-yl 2-(bicyclo[2.2.1]heptan-2-yl)-1,1,2,2-tetrafluoroethanesulfonate, 1-3-dioxoisoindolin-2-yl N-[2-(tetracyclo[4.4.0.1$^{2,5}$.1$^{7,10}$]dodecan-3-yl)-1,1-difluoroethanesulfonate, 1,3-dioxo-1H-benzo[de]isoquinolin-2(3H)-yl trifluoromethanesulfonate, 1,3-dioxo-1H-benzo[de]isoquinolin-2(3H)-yl nonafluoro-n-butane sulfonate, 1,3-dioxo-1H-benzo[de]isoquinolin-2(3H)-yl perfluoro-n-octanesulfonate, 1,3-dioxo-1H-benzo[de]isoquinolin-2(3H)-yl 2-(bicyclo[2.2.1]heptan-2-yl)-1,1,2,2-tetrafluoroethanesulfonate, or 1,3-dioxo-1H-benzo[de]isoquinolin-2(3H)-yl N-[2-(tetracyclo[4.4.0.1$^{2,5}$.1$^{7,10}$]dodecan-3-yl)-1,1-difluoroethanesulfonate, (E)-2-(4-methoxystyryl)-4,6-bis(trichloromethyl)-1,3,5-triazine, 2-(Methoxyphenyl)-4,6-bis-(trichloromethyl)-s-triazine, 2-[2-(Furan-2-yl)ethenyl]-4,6-bis(trichloromethyl)-s-triazine, 2-[2-(5-methylfuran-2-yl)ethenyl)-4,6-bis(trichloromethyl)-s-triazine, 2-[2-(3,4-Dimethoxyphenyl)ethenyl]-4,6-bis(trichloromethyl)-s-triazine, equivalents thereof or combinations thereof. Suitable photoacid generators may also include onium salts comprising anions and cations in combinations not shown supra.

The photosensitive composition disclosed herein may also comprise photosensitizers that extend the effective wavelength and/or energy range. Such photosensitizers may be, without limitation, substituted and unsubstituted anthracenes, substituted and unsubstituted phenothiazines, substituted and unsubstituted perylenes, substituted and unsubstituted pyrenes, and aromatic carbonyl compounds, such as benzophenone and thioxanthone, fluorene, carbazole, indole, benzocarbazole, acridone chlorpromazine, equivalents thereof or combinations of any of the foregoing.

In accordance with the present disclosure, the novel composition comprises one or more polymers. The polymers may comprise one or more repeat units. In particular, polymers may comprise repeat units chosen from styrenic repeat units, (meth)acrylate repeat units or combinations thereof. The composition may further comprise a combination of 2 or more polymers, such as a novolak polymer and an acrylate and/or styrenic copolymer. The polymers within the scope of this invention are disclosed in U.S. application Ser. No. 13/524,790 filed Jun. 15, 2012 and incorporated herein in its entirety.

More particularly, styrenic repeat units may have the structure

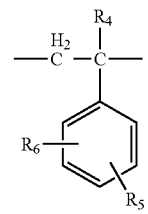

where $R_4$ is chosen from H, Cl or $CH_3$ and $R_5$ and $R_6$ can be the same or different, and are chosen from H, OH, $OCOOR_7$, or $OCOCOOR_7$ and $R_7$ is an acid cleavable group. The polymer of the present invention may comprise (meth)acrylate units only or a mixture of (meth)acrylate and styrenic units. Acid labile groups may be present in the polymer. The polymer may comprise acid cleavable groups which may be esterified to a (meth)acrylate repeat unit via the carboxylate group or to a carbonate or oxylate group; which carbonate or oxylate group is, in turn, esterified to a phenol or an alcohol. For example, a monomer repeat unit, known in the art, is tert-butyl 4-vinylphenyl carbonate, in which a tert-butyl carbonate is esterified to 4-hydroxystyrene. Acid cleavable groups may include, without limitation, a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo [2.2.1]heptan-2-yl group, a 2-ethyl-1,3,3-trimethylbicyclo [2.2.1]heptan-2-yl group, a 2,6,6-trimethylbicyclo[3.1.1] heptan-2-yl group, a 2,3-dimethylpentan-3-yl group, or a 3-ethyl-2-methylpentan-3-yl group. A monomer repeat unit with an acid cleavable group is said to be protected. Polymers may be fully protected, partially protected, partially deprotected or fully deprotected. Deprotection may occur, for example, during or after exposure of the photosensitive composition when photogenerated acid is present.

In addition to monomer repeat units having acid cleavable groups, polymers may further comprise monomer repeat units that impart etching resistance, modify the dissolution characteristics of the polymer in its protected, partially protected, partially deprotected or fully deprotected forms, modify photosensitivity, modify adhesion, provide a bound photoacid generator or impart other useful characteristics. Monomer repeat units may include, without limitation, certain chemical functionalities such as lactones, anhydrides, alcohols, carboxylic acids, substituted and unsubstituted benzyl groups, ethers, alicyclic esters, ester alcohols, ester ethers, aliphatic esters, aromatic esters and the like Monomers may include, without limitation, (meth)acrylic acid, 2-methoxyethyl (meth)acrylate, 2-ethoxyethyl (meth) acrylate, benzyl (moth)acrylate, 2-hydroxypropyl (meth)

acrylate, 4-hydroxybenzyl (meth)acrylate, 2-isobornyl methacrylate, 3-isobornyl (meth)acrylate, 1-adamantyl (meth)acrylate, styrene, 4-hydroxystyrene, tert-butyl 4-vinylphenyl carbonate, mevalonic lactone methacrylate, 2-oxotetrahydrofuran-3-yl (meth)acrylate, 2-oxotetrahydro-2H-pyran-3-yl (meth)acrylate, or 2-oxooxepan-3-yl (meth)acrylate.

The acrylate polymer may comprise a structure of the following formula:

(5)

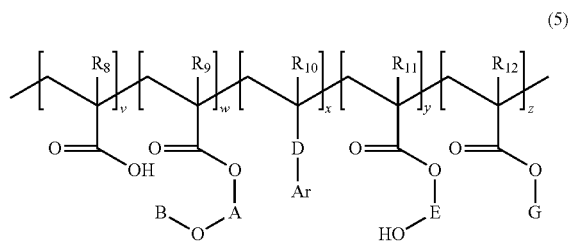

wherein $R_8$-$R_{12}$ are, independently, —H, F or —CH$_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —COOCH$_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %. Substituted Ar may be inclusive of an aromatic group substituted with hydroxyl group. Ar may be phenyl or hydroxyphenyl. The general formula above is not meant to show the exact positioning of the component parts of the polymer so that the parts may exist together randomly, as well, 2 or more of the same component part may exist side-by-side in the polymer.

In accordance with the above embodiments, with reference to (5), an exemplary molar percentage range for v may be 0-10%. A further exemplary molar percentage range for v may be 3-8%. A still further exemplary mole percentage range for v may be 4-6%. An exemplary molar percentage range for w may be 0-20%. A further exemplary molar percentage range for w may be 7-15%. A still further exemplary mole percentage range for w may be 9-12%. An exemplary molar percentage range for x may be 14-80%. A further exemplary molar percentage range for x may be 15-30%. A still further exemplary mole percentage range for x may be 16-20%. An exemplary molar percentage range for y may be 0-40%. A further exemplary molar percentage range for y may be 25-35%. A still further exemplary mole percentage range for y may be 28-33%. An exemplary molar percentage range for z may be 20-50%. A further exemplary molar percentage range for z may be 25-40%. A still further exemplary mole percentage range for z may be 29-36%. Mole percentages are not independent in that they must add to 100%.

In accordance with the above embodiments, (5) may be synthesized using one or more feeds of the indicated monomers. At least some of the monomers may be introduced at the beginning of the polymerization reaction in whole or in part. Further, monomer feeds may be accomplished at selected feed rates during the reaction to accommodate different monomer co-reactivities or to control other polymer properties such as molecular weight or solubility. Polymerization may be initiated by free radical initiators, cationic polymerization initiators, anionic polymerization initiators or chelating catalysts.

Novolak polymers used in the novel composition comprise repeat units having bridges and phenolic compounds. Suitable phenolc compounds include, without limitation, phenols, cresols, substituted and unsubstituted resorcinols, xylenols, substituted and unsubstituted benzene triols and combinations thereof. Novolak polymers are produced, usually, with an acid catalyst, by condensation polymerization of phenolic compounds and aldehydes such as formaldehyde, acetaldehyde or substituted or unsubstituted benzaldehydes or condensation products of phenolic compounds and substituted or unsubstituted methylol compounds. Bridges described supra may comprise methylene groups or methyne groups. Novolak polymers can also be made as condensation products of ketones such as acetone, methyl ethyl ketone, acetophenone and the like. Catalysts may include Lewis acids, Brønstead acids, dicationic and tricationic metal ions and the like. For example, without limitation, aluminum chloride, calcium chloride, manganese chloride, oxalic acid, hydrochloric acid, sulfuric acid, methane sulfonic acid trifluoromethane sulfonic acid or combinations comprising any of the foregoing may be used.

Examples of suitable novolak polymers include those obtained by the condensation reaction between a phenolic compound such as phenol, o-cresol, m-cresol, p-cresol, 2-5-xylenol and the like with an aldehyde compound such as formaldehyde in the presence of an acid or multivalent metal-ion catalyst. An exemplary weight average molecular weight for the alkali-soluble novolak polymer may be in the range from 1,000 to 30,000 Daltons. A further exemplary weight average molecular weight may be from 1,000 to 20,000 Daltons. A still further exemplary weight average molecular weight may be from 1,500 to 10,000 Daltons. Exemplary bulk dissolution rates for novolak polymers in 2.38% aqueous tetramethylammonium hydroxide are 10 Å/sec (Angstrom units per second) to 15,000 Å/sec. Further exemplary bulk dissolution rates are 100 Å/sec to 10,000 Å/sec. Still further exemplary bulk dissolution rates are 200 Å/sec to 5,000 Å/sec. A still further exemplary bulk dissolution rate of 1,000 Å/sec may be obtained from a single novolak polymer or a blend of novolak polymers, each comprising m-cresol repeat units.

Exemplary cresylic novolak polymers may comprise, in cresol mole percentage terms, 0%-60% p-cresol, 0%-20% o-cresol, and 0%-80% m-cresol. Further exemplary cresylic novolak polymers may comprise 0%-50% p-cresol, 0%-20% o-cresol, and 50%-100% m-cresol. Repeat units in novolak polymers are defined by the composition of the polymer, so that, for example, p-cresol may be introduced by polymerization with an aldehyde or by dimethylol-p-cresol. Moreover, cresylic novolak polymers may contain other phenolic compounds such as phenol, xylenols, resorcinols, benzene triols and the like. Further, novolak polymers can be branched or linear and may be blended to achieve a selected repeat unit mole percentage or dissolution rate. Bulk dissolution rates may be measured by the following procedure: (1) A 1-3 μm (micrometer) film of the novolak resin is spin-coated from a solution on a silicon wafer and soft baked at 110° C. for 120 seconds on a contact hot plate. (2) The film thickness is measured using an optical method such as interferometry or elipsometry or a mechanical profilometer. (3) The coated wafer is immersed in a solution of tetramethylammonium hydroxide (TMAH) developer and the time to dissolve completely the novolak film ($t_c$) is detected visually or by means of optical inteferometry (for example, a dissolution rate monitor). The bulk dissolution rate is calculated dividing the film thickness by $t_c$.

Polymers having the general composition (5) may comprise (meth)acrylic repeat units as well as substituted or unsubstituted styrene units. Accordingly, $R_8$-$R_{12}$ may, independently, be either —H or —CH$_3$.

In (5), supra, exemplary groups for A may be, without limitation, methylene, methylmethylene, ethylene, 1,2-propylene, 2,1-propylene or the like. Exemplary groups for B may be, without limitation, methyl, ethyl, propyl, isopropyl, butyl, isobutyl or the like. Exemplary groups for E may be, without limitation, methylene, methylmethylene, ethylene, 1,2-propylene, 2,1-propylene or the like. Exemplary groups for D may be, —COOCH$_2$—, wherein the carbonyl carbon is bonded to the polymer backbone, a chemical bond or a —COO— group, wherein the carbonyl carbon is bonded to the polymer backbone. Exemplary groups for —Ar may be, without limitation, phenyl, 2-, 3-, or 4-methylphenyl, 2-, 3-, or 4-hydroxyphenyl, 1-, 2-, or 3-naphthyl, or the like. In (5-1-), supra, exemplary acid cleavable groups for G may be, without limitation, a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

Exemplary weight average molecular weights of the structure (5) may, without limitation, range from 800 Daltons to 30,000 Daltons. Further exemplary weight average molecular weights of the structure (5) may, without limitation, range from 1,500 Daltons to 20,000 Daltons. Still further exemplary weight average molecular weights of the structure (5) may, without limitation, range from 2,500 Daltons to 20,000 Daltons.

The formulations disclosed and claimed herein, in one embodiment, comprise both novolak polymers and (meth) acrylate polymers such as having the general formula (5). As an example and without limitation, novolak polymers may comprise from 20% to 80% w/w of the total polymer loading. As a further example and without limitation, novolak polymers may comprise from 30% to 75% w/w of the total polymer loading. As a still further example and without limitation, novolak polymers may comprise from 40% to 65% w/w of the total polymer loading. The novel composition may have total solid content in the range of 30-65 weight %, and may be used for forming coatings of 5-200 microns.

The photosensitive composition disclosed herein may be dissolved in an organic solvent. Examples of suitable organic solvents include, without limitation, butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, gamma butyrolactone. These solvents may be used singly or in a mixture of two or more.

Other optional additives, which have compatibility with and can be added to the composition disclosed and claimed herein according to need, include auxiliary resins, plasticizers, surface leveling agents and stabilizers to improve the properties of the resist layer, coloring agents to increase the visibility of the patterned resist layer formed by development, antihalation dyes, tetraalkylammonium salts such as tetrabutylammonium oxalate and the like.

Surface leveling agents may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.).

The procedure for the preparation of a patterned photoresist layer by using the photosensitive composition disclosed herein can be conventional. For example, a substrate such as a semiconductor silicon wafer or one with a metal coating as described previously, is evenly coated with the photosensitive composition in the form of a solution by using a suitable coating machine such as a spin-coater followed by baking in a convection oven or on a hotplate to form a photoresist layer which is then exposed pattern-wise to actinic radiation such as deep ultraviolet light, near ultraviolet light, or visible light emitted from low-pressure, high-pressure and ultra-high-pressure mercury lamps, arc lamps, xenon lamps, ArF, KrF and F$_2$ excimer lasers, electron beams, x-rays, extreme UV sources, and the like through a photomask or a from a reflective mask bearing a desired pattern on an exposure apparatus and electron beams scanned in accordance with a desired pattern to build up a latent image of the pattern in the resist layer. The actinic radiation may range from 250 nm to 436 nm. Thereafter, the latent image in the photoresist layer may optionally be baked in a convection oven or on a hotplate, developed using an alkaline developer solution such as an aqueous solution of tetra ($C_1$-$C_4$ alkyl)ammonium hydroxide, choline hydroxide, lithium hydroxide, sodium hydroxide, or potassium hydroxide, for example, tetramethyl ammonium hydroxide, in a concentration of 1 to 10% w/w, to yield a patterned photoresist layer having good fidelity to the pattern of the photomask.

Thicknesses may range from 20 nm to 100 microns. To achieve these thicknesses, a combination of different spin speeds and total solids concentrations may be employed. Depending on the size of the substrate, spin speeds of from 500 rpm to 10,000 rpm may be used. Concentration may be expressed as a percentage w/w of total solids in the photosensitive composition. Without limitation, an exemplary total solids percentage w/w is from 0.05% to 65%. Without limitation, a further exemplary total solids percentage w/w is from 20% to 60%. Without limitation, a further exemplary total solids percentage w/w is from 40% to 55%.

The photosensitive composition comprises one or more polymers, one or more photoacid generators, one or more solvents and one or more heterocyclic thiol additives shown supra. The photosensitive composition may further contain a solvent, as noted supra. Given as a percentage w/w of total solids, for example, polymers may be present at from 30% to 80% of total solids, photoacid generators may be present from 20% to 70% of total solids, heterocyclic thiol additives may be present from 0.01% to 1% of total solids. Alternatively, polymers may be present at from 40% to 60% of total solids, photoacid generators may be present from 30% to 60% of total solids, heterocyclic thiol additives may be present from 0.01% to 1% of total solids.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Synthesis Example 1

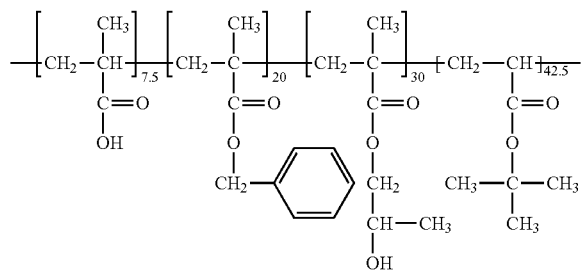

Monomer repeat unit percentages are given as mole percentages. In this example, 6.46 g of methacrylic acid, 35.24 g of benzyl methacrylate, 43.25 g of hydroxypropyl methacrylate, 54.47 g of tert-butyl acrylate were mixed in 209.1 g of PGME solvent. The polymerization reaction proceeds in the presence of 2.3 g of AIBN at 90° C., under nitrogen for 18 hours. After cooling down to room temperature, the reaction mixture was precipitated in DI water. The polymer solid was washed and dried under vacuum at 45° C., yielding 137.1 g (98% yield) with a weight average molecular weight of 15,072 Daltons.

Synthesis Example 2

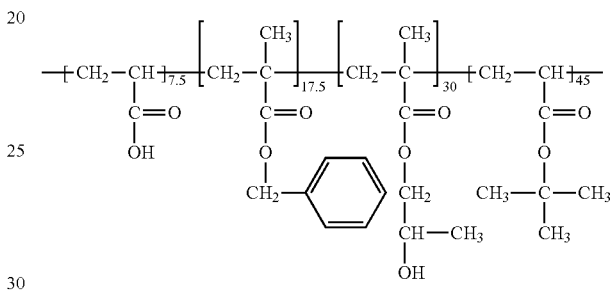

Monomer repeat unit percentages are given as mole percentages. In this example, 4.32 g of acrylic acid, 24.67 g of benzyl methacrylate, 34.60 g of hydroxypropyl methacrylate, 46.14 g of tert-butyl acrylate were mixed in 207.1 g of PGME solvent. The polymerization reaction proceeded in the presence of 1.84 g of AIBN at 90° C., under nitrogen for 18 hours. After cooling down to room temperature, the reaction mixture was precipitated in DI water. The polymer solid was washed and dried under vacuum at 45° C., yielding 107.3 g (98% yield) with a weight average molecular weight of 16,138 Daltons.

Synthesis Example 3

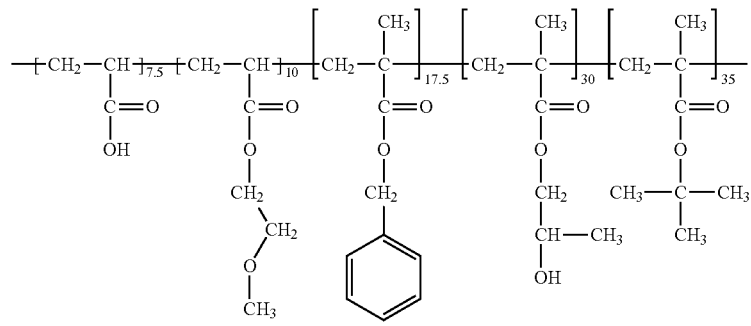

2.7 g of acrylic acid, 6.5 g of methoxyethyl acylate, 15.4 g of benzyl methacrylate, 21.6 g of hydroxypropyl methacrylate, 24.9 g of tert-butyl methacrylate were mixed in 135.2 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 70.3 g (99% yield) with a weight average molecular weight of 17,153 Daltons.

Synthesis Example 4

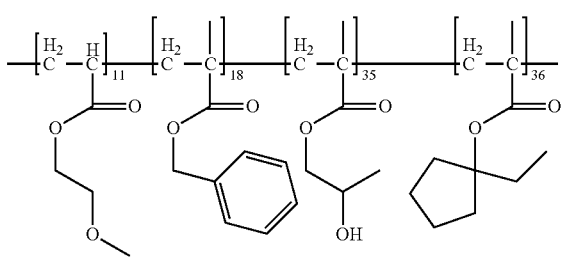

Monomer repeat unit percentages are given as mole percentages. In this example, 7.16 g of methoxyethyl acrylate, 15.86 g of benzyl methacrylate, 25.23 g of hydroxypropyl methacrylate, 32.78 g of 1-ethylcyclopentyl methacrylate were mixed in 152.6 g of PGME solvent. The polymerization reaction proceeded in the presence of 1.2 g of AIBN at 90° C., under nitrogen for 18 hours. After cooling down to room temperature, the reaction mixture was precipitated in DI water. The polymer solid was washed and dried under vacuum at 45° C., yielding 79.3 g (98% yield) with a weight average molecular weight of 17,888 Daltons.

Novolak polymers: For the following formulation examples, three novolak polymers were used. Novolak-1 was synthesized from m-cresol and formaldehyde and had a bulk dissolution rate in 2.38% aqueous TMAH developer of 700 Å/sec. Novolak-2 was synthesized from m-cresol and formaldehyde and had a bulk dissolution rate in 2.38% aqueous TMAH developer of 1,600 Å/sec. Novolak-3 is a 1/1 blend of Novolak-1 and Novolak-2, with a bulk dissolution rate in 2.38% aqueous TMAH developer of 1,000 Å/sec.

Polymer (GIJ): is commercially available from DuPont, it is a tertiary polymer of 60% hydroxystyrene, 20% styrene and 20% tertiary butylacrylate.

PAG: 1,3-dioxo-1H-benzo[de]isoquinolin-2(3H)-yl trifluoromethanesulfonate. It also called naphthalene dicarboximidyl triflate.

Lutonal M40: is a plasticizer, commercially available from BASF

Polyglykol B01/40: is a plasticizer, commercially available from Clariant Corporation Lithographic Photoresist Processing Coating: All formulations were tested on 8" diameter Si and Cu wafers. The Si wafers were dehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The photoresist coatings were prepared by spin coating the photoresist samples and applying a soft bake for 300 seconds at 130° C. on standard wafer track hot plate in contact mode. The spin speed was adjusted to obtain 40 micron thick photoresist films. All film thickness measurements were conducted on Si wafers using optical measurements.

Imaging: The wafers were exposed on SUSS MA200 CC Mask Aligner. The photoresist was post exposure baked at 100° C. for 100 seconds and puddle developed for 240 seconds in AZ 300 MIF (0.26N aqueous solution of tetramethyl ammoniumhydroxide=TMAH) at 23° C. The developed photoresist images were inspected using Hitachi S4700 or AMRAY 4200L electron microscopes.

FORMULATION EXAMPLES

Formulation Example 1

10.0 g polymer of Synthesis Example 1, 15.0 g of Novolak-3, 0.18 g of PAG, 0.043 g of tetrabutyl ammonium oxalate and 0.025 g of 1,3,5-triazine-2,4,6-trithiol were dissolved in 27.4 g of PGMEA solvent to make a solution. The solution was coated on copper wafers for the lithography test as above. Lithographic results showed good profiles having straight vertical walls and no footing.

Formulation Example 2

10.0 g polymer of Synthesis Example 2, 15.0 g of Novolak-3, 0.18 g of PAG, 0.043 g of tetrabutyl ammonium oxalate and 0.025 g of 1,3,5-triazine-2,4,6-trithiol were dissolved in 27.4 g of PGMEA solvent to make a solution. The solution was coated on copper wafers for the lithography test as a solution. The solution was coated on copper wafers for the lithography test as above. Lithographic results showed good profiles having straight vertical walls and no footing.

Formulation Example 3

10.0 g polymer of Synthesis Example 3, 15.0 g of Novolak-3, 0.18 g of PAG, 0.043 g of tetrabutyl ammonium oxalate and 0.025 g of 1,3,5-triazine-2,4,6-trithiol were dissolved in 27.4 g of PGMEA solvent to make a solution. The solution was coated on copper wafers for the lithography test as above. Lithographic results showed good profiles having straight vertical walls and no footing.

Formulation Example 4

10.0 g polymer of Synthesis Example 4, 15.0 g of Novolak-3, 0.18 g of PAG, 0.043 g of tetrabutyl ammonium oxalate and 0.025 g of 1,3,5-triazine-2,4,6-trithiol were dissolved in 27.4 g of PGMEA solvent to make a solution. The solution was coated on copper wafers for the lithography test as above. Lithographic results showed good profiles having straight vertical walls and no footing.

Formulation Example 5

10.0 g polymer of Synthesis Example 3, 15.0 g of Novolak-3, 0.18 g of PAG, 0.043 g of tetrabutyl ammonium oxalate and 0.025 g of 1,3,4-thiadiazole-2,5-dithiol were dissolved in 27.4 g of PGMEA solvent to make a solution. The solution was coated on copper wafers for the lithography test as above. Lithographic results showed good profiles having straight vertical walls and no footing.

Formulation Example 6

10.0 g polymer of Synthesis Example 4, 15.0 g of Novolak-3, 0.18 g of PAG, 0.043 g of tetrabutyl ammonium oxalate and 0.025 g of 1H-1,2,4-triazole-3-thiol were dissolved in 27.4 g of PGMEA solvent to make a solution. The solution was coated on copper wafers for the lithography test as above. Lithographic results showed good profiles having straight vertical walls and no footing.

Formulation Example 7

10.0 g polymer of Synthesis Example 3, 15.0 g of Novolak-3, 0.18 g of PAG, 0.043 g of tetrabutyl ammonium oxalate and 0.025 g of 6-methyl-2-thiouracil were dissolved in 27.4 g of PGMEA solvent to make a solution. The solution was coated on copper wafers for the lithography test as above. Lithographic results showed profiles having slightly sloped walls with slight foot at the substrate and free of scum. The profiles were acceptable.

Formulation Example 8

10.0 g polymer of Synthesis Example 3, 15.0 g of Novolak-3, 0.18 g of PAG, 0.043 g of tetrabutyl ammonium oxalate and 0.025 g of 6-Aza-2-thiothymine were dissolved in 27.4 g of PGMEA solvent to make a solution. The solution was coated on copper wafers for the lithography test as above. Lithographic results showed profiles having slightly concave walls without footing and scum. The profiles were acceptable.

Formulation Example 9

10.0 g polymer of Synthesis Example 3, 15.0 g of Novolak-3, 0.18 g of PAG, 0.043 g of tetrabutyl ammonium oxalate and 0.025 g of 2-thiobarbituric acid were dissolved in 27.4 g of PGMEA solvent to make a solution. The solution was coated on copper wafers for the lithography test. Lithographic results showed profiles having slightly concave walls with slight foot at the substrate and free of scum. The profiles were acceptable.

Formulation Example 10

38.919 gm Novolak-3, 58.3 (GIJ) polymer, 2.033 gm Lutonal M-40, 0.7885 gm PAG, 0.0711 gm 1H-1,2,4-triazole-3-thiol and 0.0755 gm surfactant were dissolved in 121.7 gm PGMEA solvent to obtain a photoresist solution at 45% solids. This solution was coated on copper wafers and produced 16 micron films dried at 110° C. for 180 seconds. The photoresist was processed to produce patterned images post exposure baked at 90° C. for 60 seconds and developed for 120 seconds. The resulting resist pattern profiles are vertical but had a slight foot at the substrate and are scum free. The profiles were acceptable.

Formulation Example 11

Comparative Example 38.919 gm Novolak-3, 58.126 gm (GIJ) polymer, 2.0027 gm Lutonal M-40, 0.7874 gm PAG, 0.0859 2,6-diisopropylaniline, and 0.0786 gm surfactant, dissolved in 122.22 gm PGMEA to produce a resist solution at 45% solids. This solution was coated on copper wafers and produced 16 um films dried at 110° C. for 180 seconds. The resist was processed to produce patterned images post exposure baked at 90° C. for 60 seconds and developed for 120 seconds. The resulting resist pattern profiles are poorly sloped with severe footing at the substrate. This example is used to compare with Example 10 to show the significant influence of 1H-1,2,4-triazole-3-thiol additive on photoresist profile and foot reduction on copper substrates. The profiles were not acceptable.

Formulation Example 12

34.97 gm Novolak-3, 48.26 (GIJ) polymer, 15.89 gm polymers in synthesis example 4, 0.742 gm PAG, 0.0744 gm 1H-1,2,4-triazole-3-thiol and 0.0528 gm surfactant dissolved in 111.4 gm PGMEA solvent to obtain a photoresist solution at 47.3% solids. This solution was coated on copper wafers and produced 40 um films dried at 130° C. for 300 seconds. The photoresist was processed to produce patterned images post exposure baked at 100° C. for 100 seconds and developed for 240 seconds. The resulting resist pattern profiles are vertical with a very slight foot at the substrate and are scum free. The profiles were acceptable.

Formulation Example 13

Comparative Example 27.25 gm Novolak-3, 59.8 (GIJ) polymer, 0.74 gm PAG, 0.16 gm tertiary butylammoniumoxalate, 5.0 gm Lutonal M-40, 7.0 gm Polygykol B01/40 and 0.05 gm surfactant dissolved in 112.7 gm PGMEA solvent to obtain a resist solution at 47% solids. This solution was coated on copper wafers and produced 40 um films dried at 126° C. for 540 seconds. The resist was processed to produce patterned images post exposure baked at 105° C. for 100 seconds and developed for 120 seconds. The resulting resist pattern profiles are concaved with a slight foot at the substrate. The profiles of this resist patterns provide a qualitative comparison with the vertical profiles produced by formulation of example 12, which contain an additive covered by the claimed compound of this invention. The profiles were not acceptable.

Process Results from Formulations

Compared with the formulation without additive, some additives such as 1,3,5-triazine-2,4,6-trithiol, 1,3,4-thiadiazole-2,5-dithiol, 1H-1,2,4-triazole-3-thiol, have prominent effect on profiles resulting straight vertical walls and no footing. Some additives such as 6-methyl-2-thiouracil, 6-Aza-2-thiothymine, 2-thiobarbituric acid have less effect on the profiles.

Although the present invention has been shown and described with reference to particular examples, various changes and modifications which are obvious to persons skilled in the art to which the invention pertains are deemed to lie within the spirit, scope and contemplation of the subject matter set forth in the appended claims.

What is claimed is:

1. A positive working photosensitive composition comprising:
   a. at least one photoacid generator;
   b. at least one polymer, comprising one or more (meth) acrylate repeat units and further comprising one or more repeat units with at least one acid cleavable group having formula (5), (5)

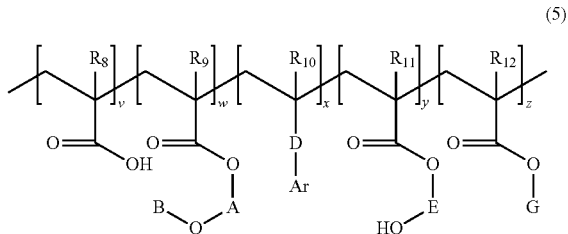

wherein $R_8$-$R_{12}$ are, independently, —H, F or —$CH_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, and further where v is 0-10 mole %, w is 0 mole %-20 mole %, x is 14 mole %-80 mole %, y is 0 mole %-40 mole % and z is 20 mole %-50 mole %;

c. at least one heterocyclic thiol compound comprising a ring structure chosen from the general formulas:

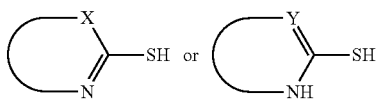

or tautomers thereof, wherein the ring structure is a single ring structure having 4-8 atoms, or a multi ring structure having 5-20 atoms, and wherein the single ring structure or the multi ring structure is chosen from the group consisting of an-aromatic ring, a non aromatic ring, and a heteroaromatic ring, and wherein X is coupled into the ring by a single bond and is chosen from the group consisting of $CR_1R_2$, O, S, Se, Te, and $NR_3$, or X is coupled into the ring by a double bond and is chosen from $CR_1$ or N, and Y is chosen from $CR_1$ or N, and wherein $R_1$, $R_2$, and $R_3$ are independently selected from a group consisting of H, a substituted alkyl group having 1-8 carbon atoms, unsubstituted alkyl group having 1-8 carbon atoms, a substituted alkenyl group having 1-8 carbon atoms, unsubstituted alkenyl group having 1-8 carbon atoms, a substituted alkynyl group having 1-8 carbon atoms, unsubstituted alkynyl group having 1-8 carbon atoms, a substituted aromatic group having 1-20 carbon atoms, a substituted heteroaromatic group having 1-20 carbon atoms, unsubstituted aromatic group having 1-20 carbon atoms and unsubstituted heteroaromatic group having 1-20 carbon atoms and further wherein the ring structures of the heterocyclic thiol compound may be unsubstituted or substituted with substituents chosen from the group consisting of saturated hydrocarbon groups, unsaturated hydrocarbon groups, aromatic rings, aliphatic alcohols, aromatic alcohols, heteroaromatic alcohols, amines, amides, imides carboxylic acids, esters, ethers, and halides.

2. The positive working photosensitive composition of claim 1, wherein the heterocyclic thiol is selected from a group consisting of 1H-1,2,4-triazole-3-thiol, 1H-1,2,4-triazole-5-thiol, 1H-benzo[d]imidazole-2-thiol, 1H-imidazole-2-thiol, 1H-imidazole-4-thiol, 1H-imidazole-5-thiol, 2-azabicyclo[2.2.1]hept-2-ene-3-thiol, 2-azabicyclo[3.2.1]oct-2-ene-3-thiol, 2-mercaptopyrimidine-4,6-diol, 3-mercapto-6-methyl-1,2,4-triazin-5-ol, 2-mercaptopyrimidin-4-ol, 2-mercapto-6-methylpyrimidin-4-ol, 1-methyl-1H-imidazole-2-thiol, 1H-indazole-3-thiol, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thioracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-t-butyl-2-thiouracil, 6-(p-chlorophenyl)-2-thiouracil, 6-(p-chlorophenyl)-2-ethyl-2-, thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil, tautomers thereof and combinations thereof.

3. The positive working photosensitive composition of claim 1, wherein the heterocyclic thiol is selected from a group consisting of, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, —1H-benzo[d]imidazole-2-thiol, 2-mercapto-6-methylpyrimidin-4-ol, 2-mercaptopyrimidin-4-ol, 1-methyl-1H-imidazole-2-thiol, 1H-indazole-3-thiol, tautomers thereof and combinations thereof.

4. The positive working photosensitive material of claim 1, wherein the at least one photoacid generator is selected from a group consisting of an onium salt, a dicarboximidyl sulfonate ester, an oxime sulfonate ester, a diazo(sulfonyl methyl) compound, a disulfonyl methylene hydrazine compound, a nitrobenzyl sulfonate ester, a biimidazole compound, a diazomethane derivative, a glyoxime derivative, a β-ketosulfone derivative, a disulfone derivative, a sulfonic acid ester derivative, an imidoyl sulfonate derivative, a halogenated triazine compound, a diazonaphthoquinone sulfonate ester and combinations thereof.

5. The positive working photosensitive composition of claim 1, wherein the acid cleavable group G is selected from a group consisting of a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

6. The positive working photosensitive composition of claim 1, wherein the polymer further comprises one or more repeat units selected from a group consisting of (meth)acrylic acid, 2-methoxyethyl (meth)acrylate, 2-ethoxyethyl (meth)acrylate, benzyl (meth)acrylate, 2-hydroxypropyl (meth)acrylate, 4-hydroxybenzyl (meth)acrylate, 2-isobornyl methacrylate, 3-isobornyl (meth)acrylate, 1-adamantyl (meth)acrylate, styrene, 4-hydroxystyrene, tert-butyl 4-vinylphenyl carbonate, mevalonic lactone methacrylate, 2-oxotetrahydrofuran-3-yl (meth)acrylate, 2-oxotetrahydro-2H-pyran-3-yl (meth)acrylate, and 2-oxooxepan-3-yl (meth)acrylate.

7. The positive working photosensitive composition of claim 1, wherein the polymer further comprises one or more styrenic repeat units having the structure

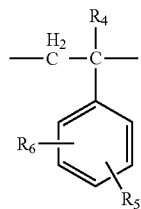

where $R_4$ is chosen from H, Cl or $CH_3$ and $R_5$ and $R_6$ can be the same or different, and are chosen from H, OH, $OCOOC(CH_3)_3$, or $OCOCOO(CH_3)_3$.

8. A method of forming a positive relief image comprising:
a. forming a photosensitive layer by applying the positive working photosensitive composition of claim 1 to a substrate;
b. image-wise exposing the photosensitive layer to actinic radiation to form a latent image;
c. developing the latent image in a developer,
d. wherein the image-wise exposed photosensitive layer is optionally thermally treated.

9. The method of claim 8 wherein the substrate comprises a chalcophile.

10. The method of claim 8 wherein the substrate is copper.

11. The positive working photosensitive composition of claim 1 further comprising an alkali-soluble novolak polymer.

12. The positive working photosensitive composition of claim 11 where the novolak has a dissolution rate in 2.38% aqueous tetramethylammonium hydroxide between 10 Å/sec to 15,000 Å/sec.

13. The positive working photosensitive composition of claim 11 where the novolak polymer comprises 20% to 80% w/w of the total polymer loading.

14. The positive working photosensitive composition of claim 11 where the novolak polymer comprises 30% to 75% w/w of the total polymer loading.

15. The positive working photosensitive composition of claim 11 were the polymer comprising one or more (meth)acrylate repeat units having formula 5 is a copolymer of methacrylic acid, benzyl methacrylate, hydroxypropyl methacrylate, and tert-butyl acrylate.

16. A positive working photosensitive composition comprising:
a. at least one photoacid generator;
b. at least one polymer, comprising one or more (meth)acrylate repeat units and further comprising one or more repeat units with at least one acid cleavable group having formula (5),

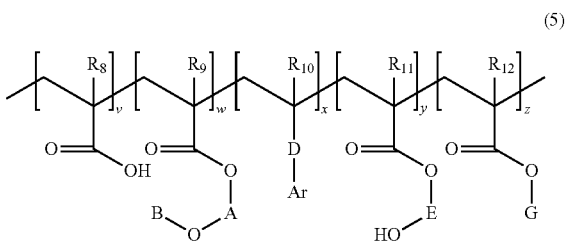

wherein $R_8$-$R_{12}$ are, independently, —H, F or —$CH_3$, A is a linear or branched C1-C10 alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, and further where v is 0-10 mole %, w is 0 mole %-20 mole %, x is 14 mole %-80 mole %, y is 0 mole %-40 mole % and z is 20 mole %-50 mole %;

c. at least one heterocyclic thiol compound chosen from the group consisting of 1H-1,2,4-triazole-3-thiol, 1H-1,2,4-triazole-5-thiol, 1H-benzo[d]imidazole-2-thiol, 1H-imidazole-2-thiol, 1H-imidazole-4-thiol, 1H-imidazole-5-thiol, 2-azabicyclo[2.2.1]hept-2-ene-3-thiol, 2-azabicyclo[3.2.1]oct-2-ene-3-thiol, 2-mercaptopyrimidine-4,6-diol, 3-mercapto-6-methyl-1,2,4-triazin-5-ol, 2-mercaptopyrimidin-4-ol, 2-mercapto-6-methylpyrimidin-4-ol, 1-methyl-1H-imidazole-2-thiol, 1H-indazole-3-thiol, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thioracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradecyl-2-thiouracil, 6-hexadecyl-2-thiouracil, 6-(2-hydroxyethyl)-2-thiouracil, 6-(3-isopropyloctyl)-5-methyl-2-thiouracil, 6-(m- nitrophenyl)-2-thiouracil, 6-(m-nitrophenyl)-5-n-propyl-2-thiouracil, 6-α-naphthyl-2-thiouracil, 6-α-naphthyl-5-t-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil, tautomers thereof and combinations thereof.

17. The positive working photosensitive composition of claim 16 further comprising an alkali-soluble novolak polymer.

18. The positive working photosensitive composition of claim 17 where the novolak has a dissolution rate in 2.38% aqueous tetramethylammonium hydroxide between 10 Å/sec to 15,000 Å/sec.

19. The positive working photosensitive composition of claim 17 where the novolak polymer comprises 20% to 80% w/w of the total polymer loading.

20. The positive working photosensitive composition of claim 17 where the novolak polymer comprises 30% to 75% w/w of the total polymer loading.

\* \* \* \* \*